United States Patent [19]
Shimoji et al.

[11] Patent Number: 5,332,915
[45] Date of Patent: Jul. 26, 1994

[54] SEMICONDUCTOR MEMORY APPARATUS

[75] Inventors: Noriyuki Shimoji; Takanori Ozawa; Hironobu Nakao, all of Kyoto, Japan

[73] Assignee: Rohm Co., Ltd., Kyoto, Japan

[21] Appl. No.: 964,043

[22] Filed: Oct. 21, 1992

[30] Foreign Application Priority Data

Oct. 30, 1991 [JP] Japan ................... 3-284585

[51] Int. Cl.$^5$ ................... H01L 29/78; H01L 29/94
[52] U.S. Cl. ................... 257/325; 257/324; 257/326
[58] Field of Search ................ 257/324, 325, 326

[56] References Cited

U.S. PATENT DOCUMENTS 3,731,163  5/1973  Shuskus ................... 257/324
4,360,900  11/1982  Bate ................... 257/324

FOREIGN PATENT DOCUMENTS 47-26983  10/1972  Japan ................... 257/325

Primary Examiner—Jerome Jackson
Attorney, Agent, or Firm—Wenderoth, Lind & Ponack

[57] ABSTRACT

A high dielectric film instead of an oxidizing film conventionally used is used in the non-volatile memory of an MoNoS construction. Using a mixed film composed of a high dielectric constant film and an amorphous insulating film for the trap film, the ratio of the voltage applied to the tunnel oxidizing film is increased so that writing and erasing operations can be effected with a low voltage. Penetration of the electrons into the electrode and the flow of positive holes from the electrode are prevented so as to increase the flow efficiency.

3 Claims, 1 Drawing Sheet

SEMICONDUCTOR MEMORY APPARATUS

BACKGROUND OF THE INVENTION

The present invention relates to a semiconductor memory apparatus, and more particularly, to a non-volatile memory of MoNoS construction.

The semiconductor memory apparatus of this type has a tunnel oxidizing film on a silicon substrate, an electric charge trap film on the tunnel oxidizing film, and a gate electrode on the trap film. The charge is trapped on the trap film from the channel portion by the application of a voltage to the gate electrode so as to remove the voltage from the gate. Thereafter, the channel is retained with the channel being retained in an ON or OFF condition by an electric field from the trapped electric charge. A nitride film or a mixed film is conventionally used as a trap film, with a defect in that the writing and erasing voltages must be high, because a high voltage is applied to the trap film.

An oxidizing film is provided on the trap film so that the size of the film may made thinner and so that the erasing and writing operations can be effected with low voltage. The oxidizing film prevents the flow of positive holes from the electrode and the penetration of electrons into the electrode, with a defect in that the writing and erasing voltages become higher as a high voltage is applied to the oxidizing film.

SUMMARY OF THE INVENTION

Accordingly, the present invention has been developed with a view to substantially eliminating the above discussed drawbacks inherent in the prior art, and its essential object is to provide an improved non-volatile memory cell.

Another important object of the present invention is to provide an improved non-volatile memory cell which is capable of effecting writing and erasing operations with a low voltage.

In accomplishing these and other objects according to one preferred embodiment of the present invention, the semiconductor memory apparatus has a tunnel oxidizing film formed on a Si substrate, a mixed film composed of a high dielectric constant insulating film and an amorphous insulating film formed on the tunnel oxidizing film, a high dielectric film formed on the mixed film, and a gate electrode formed on the high dielectric film.

The present invention uses a mixed film composed of a high dielectric constant insulating film and the amorphous insulating film for the trap film, becomes larger than the MoNoS construction with a high dielectric film (that is-a specific dielectric constant of 10 or more) being provided on it. Using the band gap of the high dielectric film, the penetration of electrons into the electrode and the flow of positive holes from the electrode are prevented so as to achieve an effect of increasing the flow efficiency of the electrons. The wiring and erasing operations can be effected with a low voltage.

BRIEF DESCRIPTION OF THE DRAWINGS

These and other objects and features of the present invention will become apparent from the following description taken in conjunction with the preferred embodiment thereof with reference to the accompanying drawings in which.

DETAILED DESCRIPTION OF THE INVENTION

Figure 1:
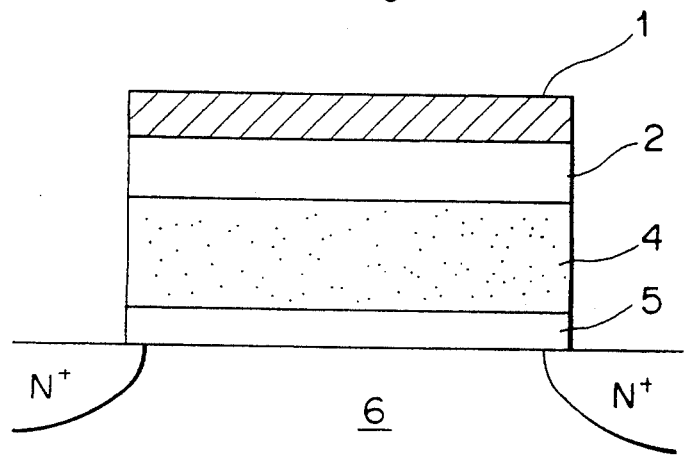
FIG. 1 is a sectional view showing one embodiment of the semiconductor memory apparatus of the present invention.

Before the description of the present invention proceeds, it is to be noted that like parts are designated by like reference numerals throughout the accompanying drawings.

The semiconductor memory apparatus of the present invention will be described hereinafter with reference to the embodiments of the drawings.

The semiconductor memory apparatus shown in FIG. 1 is provided with a tunnel oxidizing film 5 formed on a Si substrate 6, a mixed film 4 composed of a high dielectric constant insulating film and an amorphous insulating film formed on the tunnel oxidizing film 5, a high dielectric film 2 formed on the mixed film 4, and a gate electrode 1 formed on the high dielectric film 2.

The semiconductor memory apparatus of such construction as shown in FIG. 1 has a tunnel oxidizing film formed on the silicon substrate, a mixed film 4 formed between a high dielectric constant insulating film and the amorphous insulating film (including $Al_2O_3$ film) as the trap film on it. In the example of FIG. 1, the high dielectric film 2 (having a specific dielectric constant of at least 10) is sputtered on the trap film 4 or is formed by a MoCVD process and the gate electrode is attached thereby a subsequent manufacturing operation.

In the semiconductor memory apparatus constructed as described hereinabove, the trap film 4 and the high dielectric film 2 have a high specific dielectric constant. More of the voltage applied to the gate is applied to the tunnel oxidizing film so that the erasing and writing voltages can be lowered.

Figure 2:
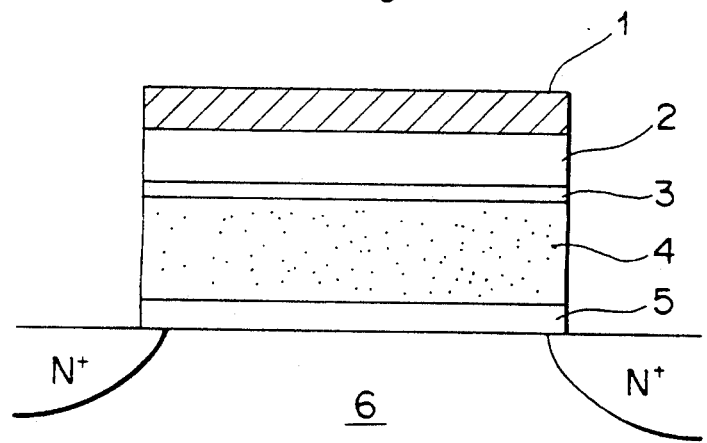
FIG. 2 is a sectional view showing a modified embodiment of FIG. 1.

The semiconductor memory apparatus shown in FIG. 2 is provided with a tunnel oxidizing film 5 formed on a Si substrate 6, a mixed film 4 composed of a high dielectric constant insulating film and an amorphous insulting film formed on the tunnel oxidizing film 5, a metallic film 3 formed on the mixed film 4, a high dielectric film 2 formed on the metallic film 3, and a gate electrode formed on the high dielectric film 2.

The semiconductor memory apparatus of the construction shown in FIG. 2 has a tunnel oxidizing film formed on the silicon substrate, a mixed film 4 formed between the high dielectric constant insulating film and the amorphous insulting film (including for example, an $Al_2O_3$ film) as the trap film on it. In the example of FIG. 2, a metallic film (platinum, tungsten or the like) is sputtered on the trap film 4 so as to improve the orientation of the high dielectric film (including strong dielectric film) 2; thereafter, the high dielectric film (including strong dielectric film) 2 is sputtered or is formed by a MoCVD process and the gate electrode is attached thereto by a subsequent manufacturing operation.

In the semiconductor memory apparatus constructed as descried hereinabove, the trap film 4 and the high dielectric film 2 have a high specific dielectric constant. Most of the voltage applied to the gate is applied to the tunnel oxidizing film so that the erasing and writing voltages can be lowered.

As is clear from the foregoing description, according to the arrangement of the present invention, a high dielectric film (having the higher dielectric constant of Al$_2$O$_3$ or the like) instead of an oxidizing film conventionally used is used in the non-voltage memory of the MoNoS construction. The ratio of the voltage to be applied to the tunnel oxidizing film is increased so that the writing and erasing operations can be effected by a low voltage. Using the band gap of the high dielectric film, the penetration of electrons into the electrode and the flow of positive holes from the electrode are prevented so as to achieve an effect of increasing the flow efficiency.

What is claimed is:

1. A semiconductor memory apparatus comprising a tunnel oxidizing film formed on a Si substrate, a mixed film composed of a high dielectric constant insulating film and an amorphous insulating film formed on the tunnel oxidizing film, a metallic film formed on the mixed film, a high dielectric film formed on the metallic film, and a gate electrode formed on the high dielectric film.

2. The semiconductor memory apparatus as defined in claim 1, wherein the high dielectric film has a band gap which prevents the penetration of electrons into the electrode and the flow of positive holes from the electrode, thereby increasing the flow efficiency of the electrons.

3. The semiconductor memory apparatus as defined in claim 1, wherein the high dielectric film is a film having a dielectric constant of Al$_2$O$_3$.

* * * * *